United States Patent [19]

Seki

[11] Patent Number: 5,532,502
[45] Date of Patent: Jul. 2, 1996

[54] CONDUCTIVITY-MODULATED-TYPE MOSFET

[75] Inventor: Yasukazu Seki, Kanagawa, Japan

[73] Assignee: Fuji Electric Co., Ltd., Kanagawa, Japan

[21] Appl. No.: 397,558

[22] Filed: Mar. 2, 1995

Related U.S. Application Data

[63] Continuation of Ser. No. 178,630, Jan. 7, 1994, abandoned, which is a continuation of Ser. No. 965,701, Oct. 23, 1992, abandoned.

[30] Foreign Application Priority Data

Oct. 24, 1991 [JP] Japan .................................. 3-275841

[51] Int. Cl.⁶ .......................... H01L 29/76; H01L 29/80; H01L 29/94
[52] U.S. Cl. .......................... 257/213; 257/258; 257/327; 257/368; 257/378
[58] Field of Search ................................ 257/213, 288, 257/327, 368, 378

[56] References Cited

U.S. PATENT DOCUMENTS 4,914,051  4/1990  Huie et al. .................................. 437/59
5,021,861  6/1991  Baliga ........................................ 357/51
5,146,298  9/1992  Eklund ....................................... 357/22

FOREIGN PATENT DOCUMENTS 2939193    4/1980  Germany.
3628857C2  2/1992  Germany.
4606886C2  6/1993  Germany.

Primary Examiner—Sara W. Crane
Assistant Examiner—Valencia Martin Wallace
Attorney, Agent, or Firm—Finnegan, Henderson, Farabow, Garrett & Dunner

[57] ABSTRACT

A conductivity-modulated-type MOSFET. A base layer is on a drain layer, and a first semiconductor region, having the opposite conductivity-type as the base layer, is in the base layer. An insulation layer is on the portion of the first semiconductor region, and a gate is on the insulation layer. A second semiconductor region, having the same conductivity type as the base layer is in the second semiconductor layer at a periphery of the MOSFET.

2 Claims, 3 Drawing Sheets

CONDUCTIVITY-MODULATED-TYPE MOSFET

This application is a continuation of application Ser. No. 08/178,630 filed Jan. 7, 1994, now abandoned, which is a continuation of Ser. No. 07/965,701 filed Oct. 23, 1992, now abandoned.

BACKGROUND OF THE INVENTION

1. Field of the Invention

The present invention relates to a conductivity-modulated MOSFET of the type which has recently attracted attention as an insulated gate bipolar transistor (hereafter abbreviated as the IGBT).

2. Discussion of the Related Art

A typical n-channel IGBT is shown in FIG. 2. In the IGBT shown in FIG. 2, the drain region of a vertical MOSFET, for handling electric power, is the opposite conductivity type as the source region. A p-type region 4 is selectively formed within a surface layer of an n-type base layer 3 which is on a $p^+$-type drain layer 1 and an $n^+$-buffer layer 2. An n-type source region 5 is selectively formed within a surface layer of the p-type region 4. A channel forming region 41 is sandwiched between the n-type layer 3 and the n-type source region 5 in the p-region 4. A gate 6, of polycrystalline silicon, is provided over the surface of the channel forming region 41. An insulating film is between the gate 6 and the channel forming region 41. A source electrode 7 contacts the p-type region 4 and the n-type source region 5, while a drain electrode 8 contacts the $p^+$-type drain layer 1. The p-type region 4 of the IGBT is fabricated by the introduction of impurities into the $n^-$-type base layer 3 using the gate 6 as a mask, and the channel forming region 41 is fabricated using a self-alignment technique.

The operation of the IGBT will now be described. As a voltage is applied to the gate 6, the portion of the p-type region located immediately below the gate becomes an n-inversion layer, and a channel is formed in the channel forming region 41. Electrons flow from the source region 5 through the channel forming region 41, and are injected into the base layer 3. Correspondingly, positive holes are injected into the base layer 3 from the drain layer 1 via the buffer layer 2, and conductivity modulation occurs. Because the on voltage of an IGBT does not rise in light of its basic principle, unlike a power MOSFET, IGBT's have been used extensively in high-voltage applications.

A conventional conductivity-modulated MOSFET device is shown in FIG. 3. As shown in FIG. 3, a p-type layer 40 is in an outermost periphery 9 of the device chip. This layer is usually formed simultaneously with the p-type layer 4 by the introduction of impurities from outside a thick oxide film 11.

The source region 4 contacts the source electrode 7 connected to a source terminal S which is normally at the ground potential. When the device is off, a depletion layer spreads from the source region 4 toward the drain layer 1 having the drain potential. At the same time, the depletion layer also spreads toward an outer periphery 9 of the chip which is at the drain potential. An electrode 10 is formed in contact with the p-type region 40 to stop the spread of the depletion layer.

In a high-voltage withstanding device, a material having a high specific resistance is used for the $n^-$-type layer 3 because of the avalanche withstand voltage. For this reason, the depletion layer increasingly spreads in the horizontal direction and the electrode 10 is unable to stop the spread of the depletion layer. Hence, the avalanche withstand capacity decreases undesirably.

Because of this problem, the stopper effect of the aforementioned electrode 10 is not reliable, and a parasitic transistor is formed in the horizontal direction. When the parasitic p-n-p transistor consisting of the p-type layer 4, the $n^-$-type layer 3, and the p-type layer 40 operates, the avalanche withstand capacity is undesirably decreased. The depletion layer spreads widely because of the high specific resistance of the $n^-$-type layer 3, and the remaining width of the base layer of the parasitic p-n-p transistor becomes increasingly short, creating a narrow-base transistor having a high efficiency. As a result, the parasitic p-n-p transistor is operated, undesirably decreasing the avalanche withstand capacity.

When the conventional IGBT is operated, a voltage is applied across the source and the drain. As shown in FIG. 4, there is a voltage range between 0 and $V_0$ volts called a blocking-layer voltage where current does not flow. The voltage $V_0$ is approximately 1V. The fact that a voltage range exists where current does not flow despite the application of voltage across the source and drain is a problem when the IGBT is used as a switching device in a voltage resonance circuit. In that application, even a small current flow after the application of a voltage across the source and drain would be acceptable. However, because current does not practically flow and current starts to flow when the voltage has risen slightly, the value of di/dt changes substantially in the voltage resonance circuit. Accordingly, in a coil L connected to the circuit, a voltage $\Delta V=Ldi/dt$ occurs, which becomes undesirable noise.

SUMMARY OF THE INVENTION

An object of the present invention is to provide an IGBT with an adequate avalanche withstand capacity.

A further object of the invention is to provide an IGBT which suppresses the operation of a parasitic transistor in a surface layer on a semiconductor substrate.

A further object of the present invention is to provide an IGBT which is free of the problem of the occurrence of noise due to a blocking-layer voltage portion whenever the IGBT is used as a switching device in a voltage resonance circuit.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects of the invention a conductivity modulated MOSFET is provided. The MOSFET includes a first semiconductor layer having a first conductivity type; a second semiconductor layer having a second conductivity type on the first semiconductor layer, the second semiconductor layer having a surface opposite the first semiconductor layer; a first semiconductor region having the first conductivity type in the second semiconductor layer, the first semiconductor region being at the surface of the second semiconductor layer; an insulation layer on a portion of the first semiconductor region; a gate on the insulation layer and over a portion of the first semiconductor region, the portion of the first semiconductor region under the gate being a channel forming region; and a second semiconductor region having the second conductivity type in the second semiconductor layer, the second semiconductor region being at the surface of the second semiconductor layer, and the second semiconductor region being at a periphery of the MOSFET.

BRIEF DESCRIPTION OF THE DRAWINGS

The accompanying drawings, which are incorporated in and constitute a part of this specification illustrate embodiments of the invention and, together with the description, serve to explain the principles of the invention. In the drawings.

DETAILED DESCRIPTION OF THE PREFERRED EMBODIMENTS

In a conductivity-modulated-type MOSFET, a base layer is on a drain layer, and a first semiconductor region, having the opposite conductivity-type as the base layer, is in the base layer. An insulation layer is on the portion of the first semiconductor region, and a gate is on the insulation layer. A second semiconductor region, having the same conductivity type as the base layer is in the second semiconductor layer at a periphery of the MOSFET. The semiconductor layer at the periphery of the IGBT prevents the formation of a parasitic bipolar transistor.

A horizontal MOSFET is formed, and is connected in parallel between the first semiconductor region acting as a source and the drain layer. Thus, a small current will flow after the application of a voltage across the source and drain, and noise due to a blocking layer for that voltage portion does not exist.

Figure 1:
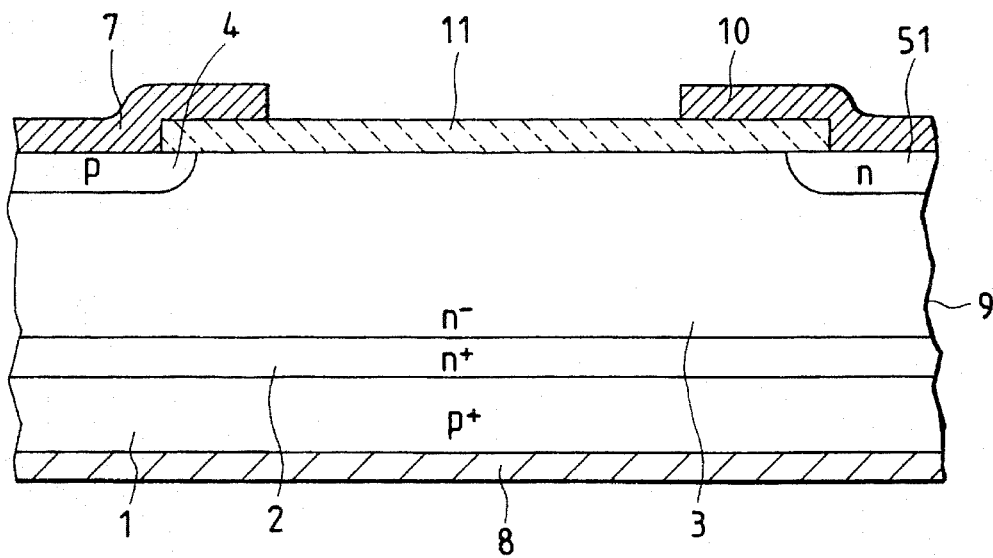
FIG. 1 is a cross-sectional view of a peripheral portion of an IGBT in accordance with an embodiment of the present invention.
Figure 3:
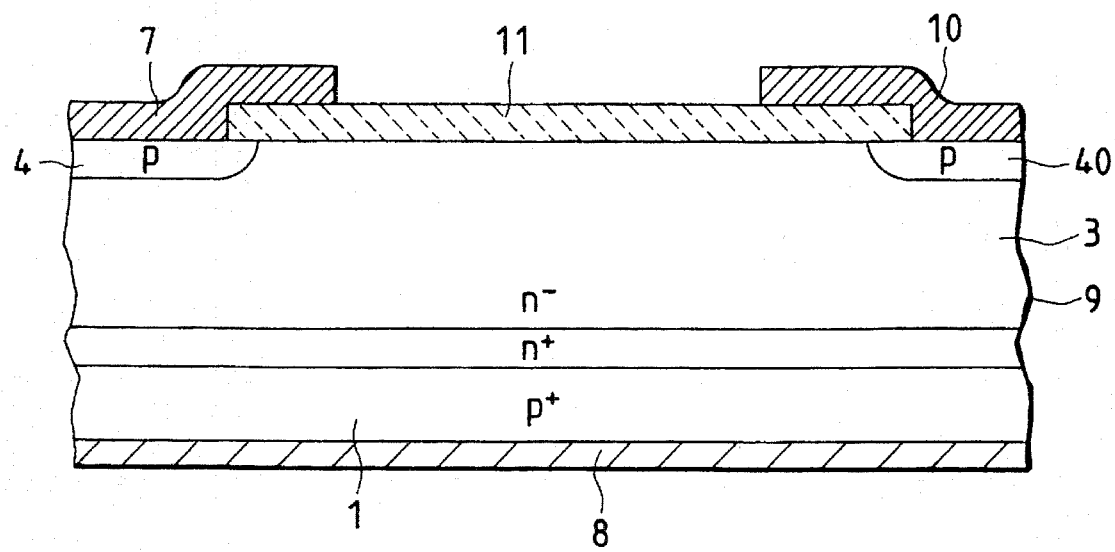
FIG. 3 is a cross-sectional view of a peripheral portion of a conventional conductivity-modulated device.
Figure 4:
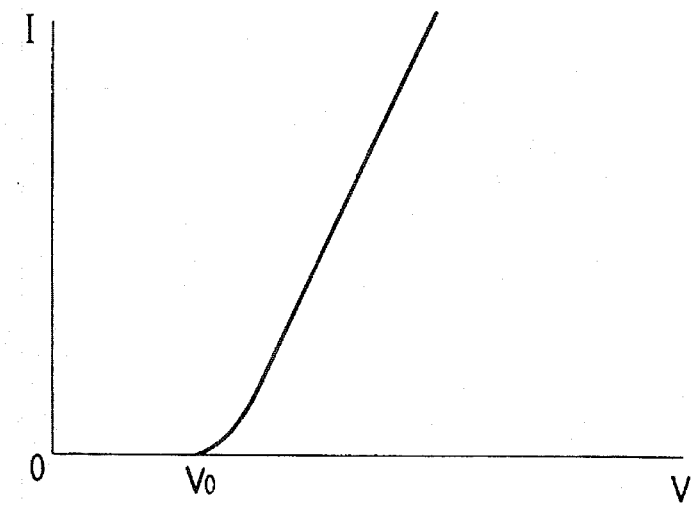
FIG. 4 is an I–V characteristic diagram of the conventional conductivity modulated device shown in FIG. 3.

FIG. 1 shows a vicinity of a periphery, similar to that shown in FIG. 3, of an IGBT chip in accordance with a first embodiment of the present invention. Common portions in FIGS. 1 and 3 are denoted by the same reference numerals.

In the process of fabricating the IGBT shown in FIG. 1, a p-type layer 4 is formed on the surface layer of an n⁻-type base layer 3 through the introduction of impurities. When the p-type layer 4 is formed, the surface in the vicinity of a periphery 9 of the chip is protected by a mask such as a resist film to prevent a p-type layer from being formed in the periphery 9. Furthermore, when a source layer 5 is formed, that mask is removed and impurities are allowed to enter the peripheral portion of the chip, thereby forming an n-type layer 51.

Figure 2:
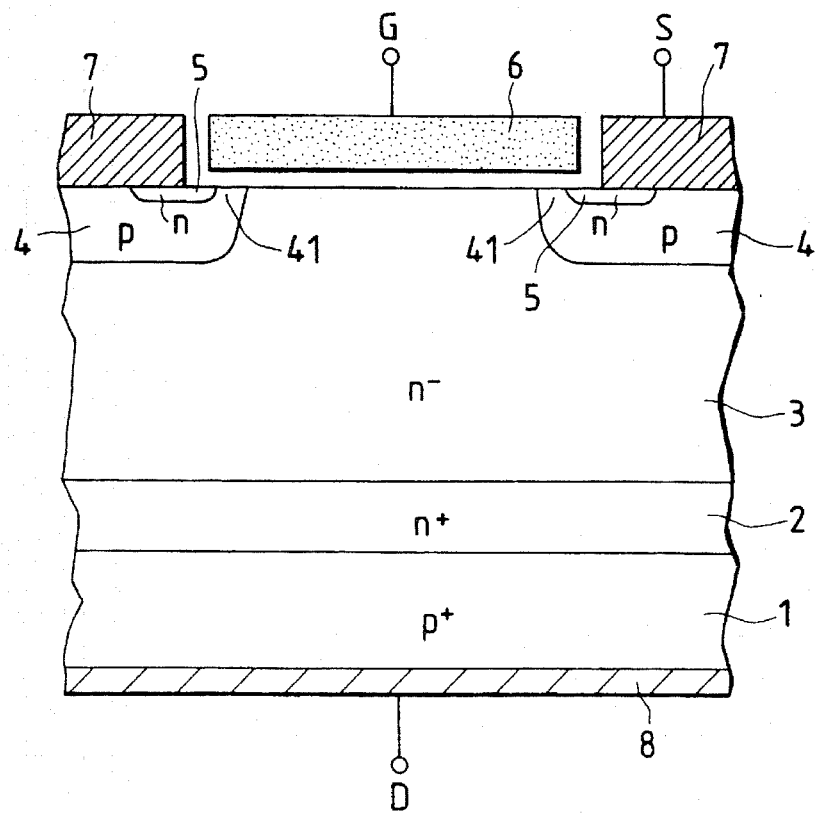
FIG. 2 is a cross-sectional diagram of an n-channel IGBT.

As a result of the above process, an IGBT without a parasitic p-n-p transistor, consisting of the p-type layer 4, the n⁻-type layer 3, and without a p-type layer 41 as shown in FIG. 2, is obtained. A diode consisting of the p-type layer 4 and the n⁻-type layer 3 is formed instead of the parasitic transistor. However, there is no deterioration of the withstand voltage such as the withstand voltage between the collector and the emitter of an open-base transistor, and the avalanche withstand capacity increases greatly.

A horizontal MOSFET, a conventional example of which is shown in FIG. 2, can be formed according to the present invention. The n-type layer 51, having a potential equivalent to that of a drain electrode 8, acts as a drain of the horizontal MOSFET, and the source layer 5 acts as a source.

Figure 5:
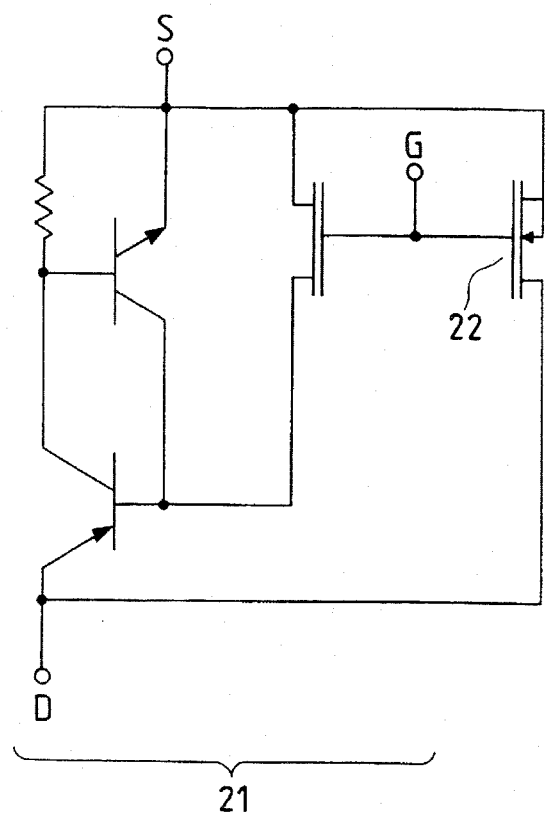
FIG. 5 is an equivalent circuit diagram of the IGBT shown in FIG. 1.
Figure 6:
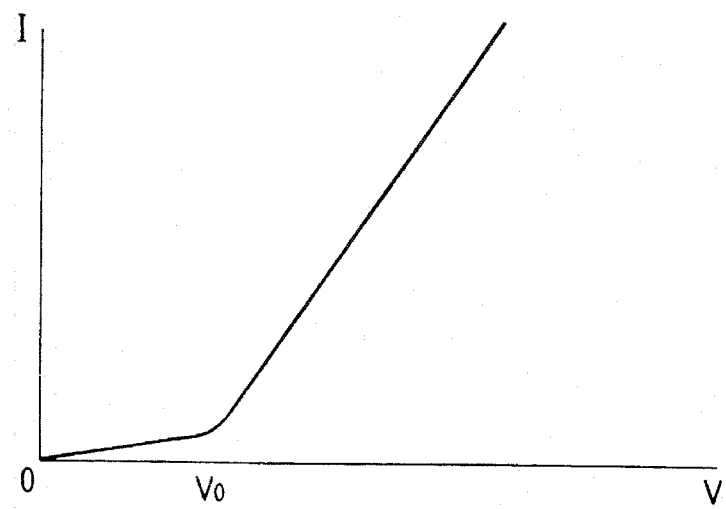
FIG. 6 is an I–V characteristic diagram of the IGBT shown in FIG. 1.

Accordingly, an equivalent circuit of the IGBT shown in FIG. 1 is shown in FIG. 5. A horizontal MOSFET 22 is connected in parallel between the source and the drain of a conventional IGBT 21, with a gate connected in common. In the MOSFET 22, when a voltage is applied to a gate electrode, a current will flow, as shown in FIG. 6. In the MOSFET 22, a current flows in the voltage range up to the blocking-layer voltage $V_0$. Accordingly, if the IGBT shown in FIG. 1 is used as a switching device in a voltage resonance circuit, the noise is reduced.

In accordance with the present invention, a layer having the same type of conductivity as that of the base layer is formed on the surface layer of the base layer which contacts a periphery of the semiconductor element assembly which is at a potential equivalent to that of the drain electrode. Therefore, the parasitic bipolar transistor which otherwise causes the avalanche withstand capacity to decline is not formed. Consequently, the avalanche withstand capacity is increased, and the horizontal MOSFET is formed in the surface layer and is connected in parallel between the source and the drain. Hence, it is possible to obtain an IGBT in which noise is not generated when it is used in a voltage resonance circuit in terms of the I–V characteristic of the IGBT.

The foregoing description of preferred embodiments of the invention has been presented for purposes of illustration and description. It is not intended to be exhaustive or to limit the invention to the precise form disclosed, and obviously many modifications and variations are possible in light of the above teachings or may be acquired from practice of the invention. The embodiments were chosen and described in order to best explain the principles of the invention and its practical application to thereby enable one skilled in the art to best utilize the invention in various embodiments and with various modifications as are suited to the particular use contemplated. It is intended that the scope of the invention be defined by the claims appended hereto.

What is claimed is:

1. A conductivity modulated MOSFET with a periphery, comprising:

a first semiconductor layer as a drain layer having a first conductivity type;

a second semiconductor layer as a buffer layer having a second conductivity type on a first surface of the first semiconductor layer;

a third semiconductor layer as a base layer having the second conductivity type on the second semiconductor layer;

a first semiconductor region selectively formed in a surface layer of the third semiconductor layer;

a second semiconductor region as a source selectively formed in a surface layer of the first semiconductor region;

a gate electrode over a surface region of the third semiconductor layer forming a channel in the first semiconductor region between the second semiconductor region and the third semiconductor layer through an insulating layer;

a drain electrode contacting a second surface of the first semiconductor layer;

a source electrode contacting surfaces of the first semiconductor region and the second semiconductor region;

a third semiconductor region having the first conductivity type reaching the periphery of the MOSFET separated from the first semiconductor region in a surface layer of the third semiconductor layer; and an electrode as a stopper contacting a surface of the third semiconductor region.

2. The conductivity-modulated MOSFET of claim 1, further comprising:

a horizontal FET, wherein:

the second semiconductor region has the same electrical potential as the electrode and is a drain; and the second semiconductor region is a source.

* * * * *